(12) United States Patent
Lee et al.

(10) Patent No.: US 11,349,303 B2
(45) Date of Patent: May 31, 2022

(54) POWER MODULE WITH INTEGRATED SURGE VOLTAGE LIMITING ELEMENT

(71) Applicant: Infineon Technologies Austria AG, Villach (AT)

(72) Inventors: Minsub Lee, Cheonan-si (KR); Byoungho Choo, Bucheon (KR); Junbae Lee, Seoul (KR); Khai Yen Charles Low, Cheonan (KR)

(73) Assignee: Infineon Technologies AG

( * ) Notice: Subject to any disclaimer, the term of this patent is extended or adjusted under 35 U.S.C. 154(b) by 148 days.

(21) Appl. No.: 16/387,821

(22) Filed: Apr. 18, 2019

(65) Prior Publication Data

US 2020/0335969 A1 Oct. 22, 2020

(51) Int. Cl.
*H02H 9/04* (2006.01)
*H01L 23/495* (2006.01)
(Continued)

(52) U.S. Cl.
CPC ......... *H02H 9/042* (2013.01); *H01L 23/3114* (2013.01); *H01L 23/495* (2013.01); *H02M 7/5387* (2013.01)

(58) Field of Classification Search
CPC ............ H02H 9/00; H02H 9/005; H02H 9/04; H02H 9/042; H02H 9/045; H02H 9/046; H02H 9/041; H01L 23/28; H01L 23/31; H01L 23/3107; H01L 23/3114; H01L 23/48; H01L 23/488; H01L 23/495; H01L 23/4951; H01L 23/49562; H02M 1/08; H02M 1/084; H02M 1/32; H02M 1/34;
(Continued)

(56) References Cited

U.S. PATENT DOCUMENTS

| 5,977,725 | A | * | 11/1999 | Miyazaki | ........... | H05B 41/2806 |
| | | | | | | 315/291 |
| 9,590,618 | B2 | * | 3/2017 | Sicard | ................ | H03K 17/0828 |
| 2015/0318848 | A1 | * | 11/2015 | Kandah | ................ | H03K 17/165 |
| | | | | | | 363/132 |

OTHER PUBLICATIONS

Schweizer, "IMS Board", [Retrieved from the internet Feb. 18, 2019], URL: <https://www.schweizer.ag/en/products-solutions/power-electronics/ims-board.html>.
(Continued)

*Primary Examiner* — Thienvu V Tran
*Assistant Examiner* — Carlos O Rivera-Perez
(74) *Attorney, Agent, or Firm* — Design IP

(57) ABSTRACT

One or more embodiments provide a power module that includes a high-side power transistor; a low-side power transistor coupled to the high-side power transistor, the low-side power transistor including a first load path terminal through which a load current enters the low-side power transistor and a second load path terminal through which the load current exits the low-side power transistor; a gate driver integrated circuit (IC) configured to drive the high-side power transistor and/or the low-side power transistor; a leadframe having a low-side voltage pin configured to be coupled to a low-side voltage source; a surge voltage limiting element coupled between the second load path terminal of the low-side power transistor and the low-side voltage pin; and a module package, where the high-side power transistor, the low-side power transistor, the gate driver IC, the leadframe, and the surge voltage limiting element are encapsulated in the module package.

22 Claims, 5 Drawing Sheets

(51) Int. Cl.
*H01L 23/31* (2006.01)
*H02M 7/5387* (2007.01)

(58) Field of Classification Search
CPC ..... H02M 1/44; H02M 2001/342–348; H02M 7/53; H02M 7/537; H02M 7/5387; H02M 7/5395; H02M 7/42; H02M 7/44; H02M 7/515; H02M 7/521; H02M 7/53878; H02M 7/003; H02M 7/219; H02M 1/342–348; H03K 17/00; H03K 17/08; H03K 17/082; H03K 17/0822; H03K 17/0826; H03K 17/0828; H03K 17/10–107; H03K 17/56; H03K 17/567; H03K 17/60; H03K 17/602; G05F 1/44; H02P 9/30

USPC ......... 361/18, 88, 90, 91.1, 91.2, 91.5, 91.6, 361/111; 323/76–278, 908; 363/50, 51, 363/55–58; 327/108–112, 306, 309, 310, 327/311, 312, 320, 321, 325, 326
See application file for complete search history.

(56) References Cited

OTHER PUBLICATIONS

Infineon Technologies AG, "CIPOS—Control Integrated Power System IGCM04G60GA," vol. 2 Issue 4 (Sep. 6, 2017), pp. 1-17.
Tyler, Matt, "In-Vehicle Electric Control Systems Using Intelligent Power Modules." EE Times, (Jan. 15, 2015) [Retrieved from the internet May 2, 2019], URL: <https://www.eetimes.com/author.asp?section_id=36&doc_id=1325306#>.
Sommervold, Dave, et al. "Optimizing the Insulated Metal Substrate Application with Proper Material Selection and Circuit Fabrication." (Oct. 15, 2015), [Retrieved from the internet May 2, 2019] URL: <https://smtnet.com/library/files/upload/Optimizing-the-Insulated-Meta-Substrate-Application.pdf>.

* cited by examiner

POWER MODULE WITH INTEGRATED SURGE VOLTAGE LIMITING ELEMENT

FIELD

The present disclosure relates generally to power modules, and, in particular, to power modules with an integrated surge voltage limiting element.

BACKGROUND

A high voltage (HV) gate driver circuit may include a low voltage (LV) gate driver used to drive a low-side transistor switch and an HV gate driver used to drive a high-side transistor switch. Such gate driver circuits may be susceptible to electrical overstress failures at the low-side gate driver and low-side transistor switch due to a surge voltage. For example, when a low-side transistor switch is turned on, current may flow through the low-side transistor switch and a shunt resistor coupled thereto. At this time, a surge voltage may be induced due to stray inductance of a printed circuit board (PCB) pattern and the shunt resistor.

Therefore, an improved device capable of limiting the surge voltage and preventing electrical overstress failures may be desirable.

SUMMARY

One or more embodiments provide a power module that includes a high-side power transistor; a low-side power transistor coupled to the high-side power transistor, the low-side power transistor including a first load path terminal through which a load current enters the low-side power transistor and a second load path terminal through which the load current exits the low-side power transistor; a gate driver integrated circuit (IC) configured to drive the high-side power transistor and/or the low-side power transistor; a leadframe having a low-side voltage pin configured to be coupled to a low-side voltage source; a surge voltage limiting element coupled between the second load path terminal of the low-side power transistor and the low-side voltage pin; and a module package, wherein the high-side power transistor, the low-side power transistor, the gate driver IC, the leadframe, and the surge voltage limiting element are encapsulated in the module package.

One or more embodiments provide a power circuit that includes a power module and a circuit external to the power module. The power module includes a high-side power transistor; a low-side power transistor coupled to the high-side power transistor, the low-side power transistor including a first load path terminal through which a current enters the low-side power transistor and a second load path terminal through which the current exits the low-side power transistor; a gate driver integrated circuit (IC) configured to drive the high-side power transistor and/or the low-side power transistor; a leadframe having a low-side voltage pin coupled to a low-side voltage source, and a further pin coupled to the second load path terminal of the low-side power transistor and to a negative power supply rail; a surge voltage limiting element coupled between the low-side voltage pin and the further pin, wherein the surge voltage limiting element provides a first current path for a first portion of the current that flows through the low-side power transistor; and a module package, wherein the high-side power transistor, the low-side power transistor, the gate driver IC, the leadframe, and the surge voltage limiting element are encapsulated in the module package; and a circuit external to the power module and coupled to the further pin, wherein the circuit provides a second current path for a second portion of the current that flows through the low-side power transistor.

BRIEF DESCRIPTION OF THE DRAWINGS

Embodiments are described herein making reference to the appended drawings.

DETAILED DESCRIPTION

Figure 1:
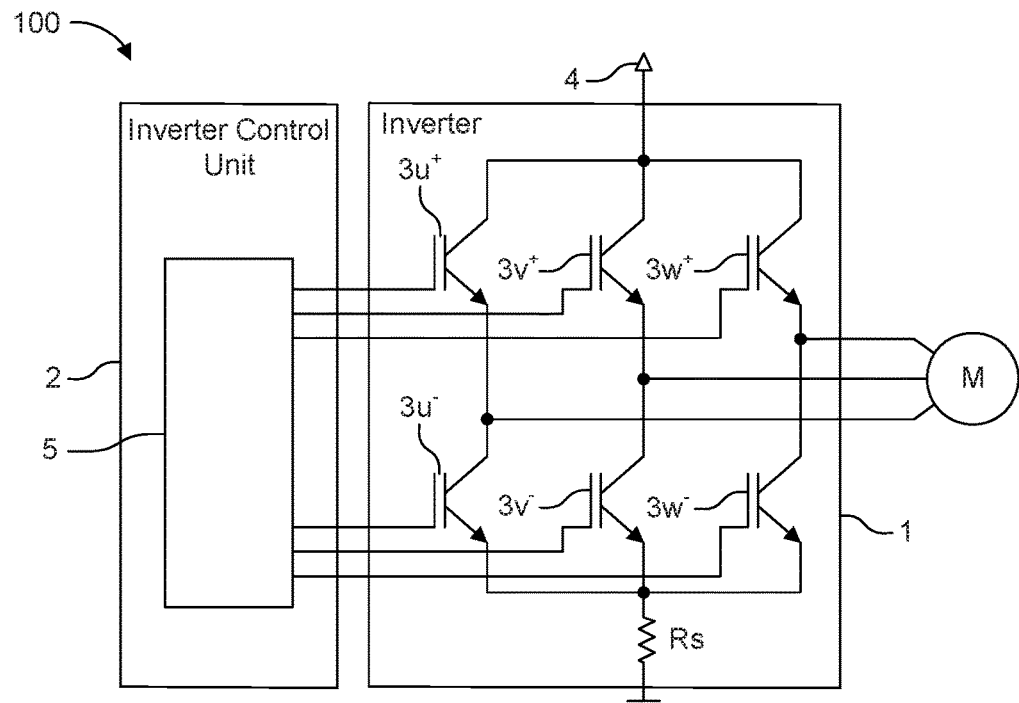
FIG. 1 is a schematic block diagram illustrating a motor control actuator of a power semiconductor device according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope defined by the claims. The following detailed description, therefore, is not to be taken in a limiting sense.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The term "substantially" may be used herein to account for small manufacturing tolerances (e.g., within 5%) that are deemed acceptable in the industry without departing from the aspects of the embodiments described herein.

A sensor may refer to a component which converts a physical quantity to be measured to an electric signal, for example, a current signal or a voltage signal. The physical quantity may, for example, be a current or a voltage at a shunt resistor in a single-shunt resistor system.

A signal processing circuit and/or a signal conditioning circuit may receive one or more signals from one or more components and perform signal conditioning or processing thereon. Signal conditioning, as used herein, refers to manipulating a signal in such a way that the signal meets the requirements of a next stage for further processing. Signal conditioning may include converting from analog to digital (e.g., via an analog-to-digital converter), amplification, filtering, converting, biasing, range matching, isolation and any other processes required to make a signal suitable for processing after conditioning.

Thus, a signal processing circuit may include an analog-to-digital converter (ADC) that converts the analog signal from the one or more sensor elements to a digital signal. The signal processing circuit may also include a digital signal processor (DSP) that performs some processing on the digital signal.

Many functions of modern devices in automotive, consumer and industrial applications, such as converting electrical energy and driving an electric motor or an electric machine, rely on power semiconductor devices. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor structure configured to conduct a load current along a load current path between two load terminal structures or load electrodes (e.g., the source/emitter and the drain/collector) of the device. Further, the load current path may be controlled by means of a control electrode, sometimes referred to as gate electrode. For example, upon receiving a corresponding control signal from, e.g., a driver unit, the control electrode may set the power semiconductor device in one of a conducting state or a blocking state. A control signal may by a voltage signal or a current signal having a controlled value.

A power transistor, also referred to as a power switch or a transistor switch, is a power semiconductor device that may be used to drive a load current. For example, an IGBT is turned "ON" or "OFF" by activating and deactivating its gate terminal. Applying a positive input voltage signal across the gate and the emitter will keep the device in its "ON" state, while making the input gate signal zero or slightly negative will cause it to turn "OFF". There is a turn-on process and a turn-off process for switching the power transistor on and off.

During the turn-on process, a gate driver integrated circuit (IC) may be used to provide (source) a gate current (i.e., an ON current) to the gate of the power transistor in order to charge the gate to a sufficient voltage to turn on the device. In particular, current Io+ is a gate driver output current used to rise (i.e., charge) the gate of the power transistor during a turn on transient. Thus, it is used to turn on the power transistor.

In contrast, during the turn-off process, the gate driver IC is used to draw (sink) a gate current (i.e., an off current) from the gate of the power transistor in order to discharge the gate sufficiently to turn off the device. Current Io− is a gate driver output current used to discharge the gate of the power transistor during a turn off transient. Thus, it is used to turn off the power transistor.

A voltage pulse may be output from the gate driver IC as the control signal according to a pulse width modulation (PWM) scheme. Thus, the control signal may be switched between an ON voltage level and an OFF voltage level during a PWM cycle for controlling a power transistor. This in turn charges and discharges the gate voltage to turn on and off the power transistor, respectively.

In particular, the gate of a power transistor is a capacitive load, and the turn ON current (i.e., gate source current) and the turn OFF current (i.e., gate sink current) are specified as the initial current when a switching event is initiated. During a turn OFF event, after some small amount of time (small compared to the PWM period), the gate current decreases and reaches a zero value when the gate reaches 0V. During a turn ON event, after some small amount of time (small compared to the PWM period), the gate current decreases and reaches a zero value when the gate reaches 15V.

Transistors may include Insulated Gate Bipolar Transistors (IGBTs) and Metal Oxide Semiconductor Field Effect Transistors (MOSFETs) (e.g., Si MOSFETs or SiC MOSFETs). While IGBTs may be used as an example in the embodiments below, it will be appreciated that MOSFETs may be substituted for the IGBTs and vice versa. In this context, when substituting a MOSFET for an IGBT, a MOSFET's drain may be substituted for an IGBT's collector, the MOSFET's source may be substituted for the IGBT's emitter, and the MOSFETs drain-source voltage $V_{DS}$ may be substituted for the IGBT's collector-emitter voltage $V_{CE}$ in any one of the examples described herein. Thus, any IGBT module may be substituted by a MOSFET module and vice versa.

Specific embodiments described in this specification pertain to, without being limited thereto, a power semiconductor device that may be used within a power converter or a power supply. Thus, in an embodiment, the power semiconductor device may be configured to carry a load current that is to be supplied to a load and/or, respectively, that is provided by a power source. For example, the semiconductor device may comprise one or more power semiconductor cells, such as a monolithically integrated diode cell, and/or a monolithically integrated transistor cell. Such diode cell and/or such transistor cells may be integrated in a power semiconductor module.

Power semiconductor devices that include transistors which are suitably connected to form half-bridges are commonly used in the field of power electronics. For example, half-bridges may be used for driving electric motors or switched mode power supplies.

For example, a multi-phase inverter is configured to provide multi-phase power by supplying multiple phase loads (e.g., a three-phase motor). For instance, three-phase power involves three symmetrical sine waves that are 120 electrical degrees out of phase with one another. In a symmetric three-phase power supply system, three conductors each carry an alternating current (AC) of the same frequency and voltage amplitude relative to a common reference but with a phase difference of one third the period. Due to the phase difference, the voltage on any conductor reaches its peak at one third of a cycle after one of the other conductors and one third of a cycle before the remaining conductor. This phase delay gives constant power transfer to a balanced linear load. It also makes it possible to produce a rotating magnetic field in an electric motor.

In a three-phase system feeding a balanced and linear load, the sum of the instantaneous currents of the three conductors is zero. In other words, the current in each conductor is equal in magnitude to the sum of the currents in the other two, but with the opposite sign. The return path for the current in any phase conductor is the other two phase conductors. The instantaneous currents result in a current space vector.

A three-phase inverter includes three inverter legs, one for each of the three phases, and each inverter leg is connected to a direct current (DC) voltage source in parallel to each other. Each inverter leg includes a pair of power transistors, for example, arranged in a half-bridge configuration for converting DC to AC. In other words, each inverter leg includes two complementary transistors (i.e., a high-side transistor and a low-side transistor) connected in series and which switch on and off complementary to the each other for driving a phase load. However, multi-phase inverters are not limited to three phases, and may include two phases or more than three phases, with an inverter leg for each phase.

FIG. 1 is a schematic block diagram illustrating a motor control actuator 100 of a power semiconductor device according to one or more embodiments. In particular, the motor control actuator 100 includes a power inverter 1 and an inverter control unit 2. The inverter control unit 2 behaves as a motor control unit and thus may also be referred to as a motor controller or a motor control IC. The motor control unit may be a monolithic IC or may be split into a microcontroller and a gate driver on two or more ICs.

The motor control actuator 100 is further coupled to a three-phase motor M, that includes three phases U, V, and W. The power inverter 1 is a three-phase current generator configured to provide three-phase power by supplying three phase currents to drive the motor M. It will be further appreciated that the power inverter 1 and the inverter control unit 2 may be placed on a same circuit board, or on separate circuit boards.

Deviations in both magnitude and phase may case a loss in power and torque in the motor M. Therefore, the motor control actuator 100 may be configured to monitor and control the magnitude and phase of the currents supplied to the motor M in real-time to ensure the proper current balance is maintained based on a feedback control loop. Open loop motor control units also exist and may be implemented.

The power inverter 1 includes a switching array of six transistor modules 3u+, 3u−, 3v+, 3v−, 3w+, and 3w− (collectively referred to as transistor modules 3) arranged in complementary pairs. Each complementary pair constitutes one inverter leg that supplies a phase current to the three-phase motor M. Thus, each inverter leg includes an upper (high-side) transistor module 3 and a lower (low-side) transistor module 3. Each transistor module may include one transistor, and may also include a diode (not shown). Thus, each inverter leg includes an upper transistor (i.e., a high-side switch) and a lower transistor (i.e., a low-side switch). Load current paths U, V, and W extend from an output of each inverter leg (i.e., the output of each half-bridge) located between complementary transistors and are configured to be coupled to a load, such as motor M. The power inverter 1 is coupled to a DC power supply 4 (e.g., a battery or a diode bridge rectifier) and to the inverter control unit 2.

In this example, the inverter control unit 2 includes a motor control circuit and a gate driver circuit for controlling the switching array. In some examples, the inverter control unit 2 may be monolithic in which the motor control circuit and gate driver circuit are integrated onto a single die. In other examples, the motor control circuit and gate driver circuit may be partitioned as separate ICs. A "monolithic" gate driver is a gate driver on a single silicon chip and may be further made with specific high voltage (HV) technology. Furthermore, the gate driver IC may be integrated on the power inverter 1 to form a power module.

The motor controller IC performs the motor control function of the motor control actuator 100 in real-time. Motor control function can include either controlling a permanent magnet motor or an induction motor and can be configured as a sensorless control not requiring the rotor position sensing, as a sensor based control with Hall sensors and/or an encoder device, or as a combination of both sensor based control (e.g., used at lower rotor speeds) and sensorless control (e.g., used at higher rotor speeds).

For example, the inverter control unit 2 includes a controller and driver unit 5 that includes a microcontroller unit (MCU) as the motor controller IC and a gate driver IC for generating driver signals for controlling the transistors of each transistor module 3. Thus, load current paths U, V, and W may be controlled by the controller and driver unit 5 by means of controlling the control electrodes (i.e., gate electrodes) of the transistors 3. For example, upon receiving a control signal from the microcontroller, the gate driver IC may set a corresponding transistor in one of a conducting state (i.e., on-state) or a blocking state (i.e., off-state).

The gate driver IC may be configured to receive instructions, including the power transistor control signals, from the MCU, and turn on or turn off respective transistors 3 in accordance with the received instructions and control signals. For example, during the turn-on process of a respective transistor 3, the gate driver IC may be used to provide (source) a gate current to the gate of the respective transistor 3 in order to charge the gate. In contrast, during the turn-off process, the gate driver IC may be used to draw (sink) a gate current from the gate of the transistor 3 in order to discharge the gate.

The inverter control unit 2 or the controller and driver unit 5 itself may include a PWM controller, an ADC, a DSP, and/or a clock source (i.e., a timer or counter) used in implementing a PWM scheme for controlling the states of each transistor, and, ultimately, each phase current provided on the respective load current paths U, V, and W.

In particular, the microcontroller of the controller and driver unit 5 may use a motor control algorithm, such as a field-oriented control (FOC) algorithm, for providing current control in real-time for each phase current output to a multi-phase load, such a multi-phase motor. Motor speed may further be controlled by adding a speed control loop on top of FOC control. Thus, FOC may be considered as an inner control loop and a speed control loop may be considered as an outer control loop. In some cases, motor position may be controlled using a third control loop (e.g., a position control loop) outside of the speed control loop.

For example, during FOC, a motor phase current should be measured such that an exact rotor position can be determined in real-time. To implement the determination of the motor phase current, the MCU 5 may employ an algorithm (e.g., space vector modulation (SVM), also referred as space vector pulse width modulation (SVPWM)) that uses single-shunt current sensing.

Furthermore, the switches 3 (i.e., transistors) of the power inverter 1 are controlled so that at no time are both switches in the same inverter leg turned on or else the DC supply would be shorted. This requirement may be met by the complementary operation of the switches 3 within an inverter leg according to the motor control algorithm.

Figure 2:
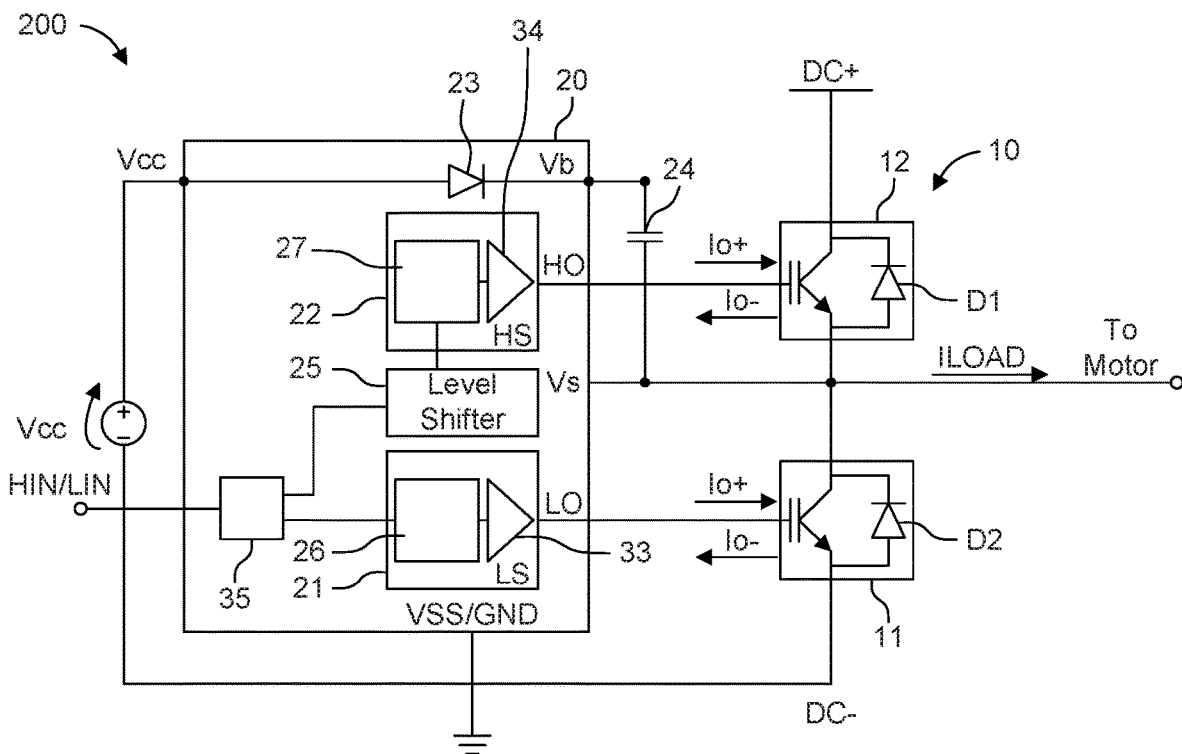
FIG. 2 is a schematic block diagram of a power module according to one or more embodiments.

FIG. 2 is a schematic block diagram of a power module 200 according to one or more embodiments. The power module 200 includes a single-phase motor drive stage 10 (i.e., an inverter leg) and a gate driver IC 20 electrically coupled to the single-phase motor drive stage 10. However, the single-phase motor drive stage may be expanded to a multiple-phase motor drive state by adding additional inverter legs. Both the single-phase motor drive stage 10 and the gate driver IC 20 are integrated into a single package (not illustrated). Thus, the power module 200 is packaged as a single device.

The single-phase motor drive stage 10 includes a low-side transistor 11 and a high-side transistor 12 that are controlled for supplying a load current $I_{LOAD}$ to a one phase of a motor (not illustrated). Freewheeling diodes D1 and D2 coupled to their respective power transistors 11 and 12 are also shown.

The gate driver 20 is a monolithic high voltage (HV) gate driver, that includes a low voltage (LV) gate driver 21 used to drive the low-side transistor switch 11 and an HV gate driver 22 used to drive the high-side transistor switch 12. Both gate drivers 21 and 22 perform gate driving of their respective power transistor 11 and 12 based on PWM signals LIN and HIN received from a microcontroller unit (MCU). The PWM signals are control signals received from the MCU at PWM logic unit 35 of the gate driver 20. The PWM logic unit 35 receives the LIN and HIN signals from the MCU and ensures there is a minimum dead time implemented to prevent bridge shoot through. Eventually, the respective PWM signals are passed on to the respective low-side and high-side gate driver 21 and 22, where the PWM signal HIN to the high-side gate driver 22 is passed through a HV level shifter 25. After this point, the low-side and high-side gate driver 21 and 22 perform gate driving.

Both gate drivers 21 and 22 include separate pre-driver circuitry 26 and 27 and buffers 33 and 34, respectively. The pre-driver circuitries 26 and 27 are configured to receive the PWM signals and, based thereon, control the on/off state of a respective first current source, such as a source FET, used to generate current Io+. Additionally, the pre-driver circuitries 26 and 27 are configured to receive the PWM signals and, based thereon, control the on/off state of a respective second current source, such as a sink FET, used to generate current Io−. The respective current sources are provided in buffers 33 and 34. Thus, the buffers 33 and 34 may each include a pair of complementary FETs used to generate turn-on currents Io+ and turn-off currents Io− for the respective power transistor 11 and 12. Each of the pre-driver circuitries 26 and 27 may further command a respective buffer 33 or 34 to use a certain current capability.

The LV gate driver 21 is arranged in a low-side region having low voltage domain, whereas the HV gate driver is arranged in high-side region having a high voltage domain.

In practice, the gate driver 20 also includes a termination region that isolates the high voltage domain from the low voltage domain, and may be referred to as an isolation termination region. Thus, the termination region provides a high voltage isolation barrier between the two voltage domains.

The gate driver 20 may be configured to receive PWM control signals, from an MCU, and turn on or turn off respective transistors 11 and 12 in accordance with the received PWM control signals. For example, during the turn-on process of a respective transistor 11 or 12, the gate driver 20 may be used to provide (source) a gate current to the gate of the respective transistor 11/12 in order to charge the gate. In contrast, during the turn-off process, the gate driver 20 may be used to draw (sink) a gate current from the gate of the transistor 11/12 in order to discharge the gate.

Thus, the MCU is electrically coupled to the gate driver 20 for the transmission of information and control signals therebetween, and the gate driver 20 is electrically coupled to the inverter leg 10 for driving the power transistors thereof.

The three regions, the HV domain, the LV domain, and the termination region are monolithically built in a single integrated circuit. The technology used to manufacture the gate driver 20 is capable of building all three regions on a single silicon die and build a single IC gate driver. In between the HV domain and the LV domain is the termination region whose main purpose is to electrically isolate the HV domain and the LV domain. The termination region in this specific technology (and in other high voltage technologies) includes a large diode usually used as bootstrap diode 23 to charge a bootstrap capacitor 24. The level shifter 25 is used to convert (i.e., level shift) the control signal, and thus transfer control information, from the low voltage/power domain to the high voltage/power domain.

In addition, Vb refers to the high-side floating supply voltage; Vs refers to the high-side floating ground voltage; Vdd or Vcc refers to the low-side and logic fixed supply voltage; Vss or Vee refers to a low-side ground voltage; HO refers to the high-side floating output voltage; LO refers to the low-side output voltage; DC+ refers to DC-link positive; DC− refers to DC-link negative; and HIN and LIN refers to the logic input voltages (i.e., control signals) received from the MCU.

Typically, Vb=Vcc−Vs−Vd, where Vd is the voltage drop across the bootstrap diode 23. When Vcc=15V, Vs=0V, and the bootstrap diode 23 is forward biased and has a forward bias voltage drop of Vd=0.5V, then Vb=15V−0V−0.5V=14.5V That is, during normal operation Vb is about 15V above Vs due to the bootstrap capacitor 24 supplying to the high side. DC+, positive power supply rail, is typically in the range of 200-1200V, but not limited thereto. On top of this, Vs is equal to DC− (e.g., Vss or 0V) when the low side switch 11 is on (and switch 12 is off). DC− is a negative power supply rail and may be shorted to Vss, as shown, but need not be. In this case, Vb is near 15V and the bootstrap capacitor 24 is charging by Vcc through the bootstrap diode 23. Otherwise, Vs is equal to DC+ when the high side switch 12 is on (and switch 11 is off), in this case Vb is 15V above DC+ and the bootstrap capacitor 24 is slowly discharging, being that the bootstrap diode 23 is reverse biased and non-conducting.

The aforementioned voltages are set such that the high-side voltage domain operates in a higher voltage or power domain than that of the low-side voltage domain. For example, the low-side (external) supply voltage Vcc may be set to 15V and the high-side supply voltage Vb may be operated at a maximum voltage of 1215V when DC+ is 1200V.

The MCU, being coupled to the LV gate driver 21, is electrically coupled to the LV domain of the gate driver 20. Thus, the MCU is configured to generate PWM control signals for controlling the transistors 11 and 12, and transmit the control signals to the gate driver 20 at the LV domain. For example, the gate driver 20 is configured to receive instructions from the MCU to drive a motor phase (i.e., an inverter leg) connected to voltage Vs using the PWM control signals. These PWM control signals are received by the gate driver 20 at the LV domain (i.e., at input pins HIN and LIN) and passed through to the corresponding HV gate driver 22 and the LV gate driver 21 via the appropriate logic (e.g., the PWM logic 35 and, for the high-side, the level shifter 25). The LV gate driver 21 and the HV gate driver 22 and are configured to receive the PWM control signals and drive the corresponding power transistor 11 and 12 via output terminals HO and LO of the gate driver 20.

Figure 3A:
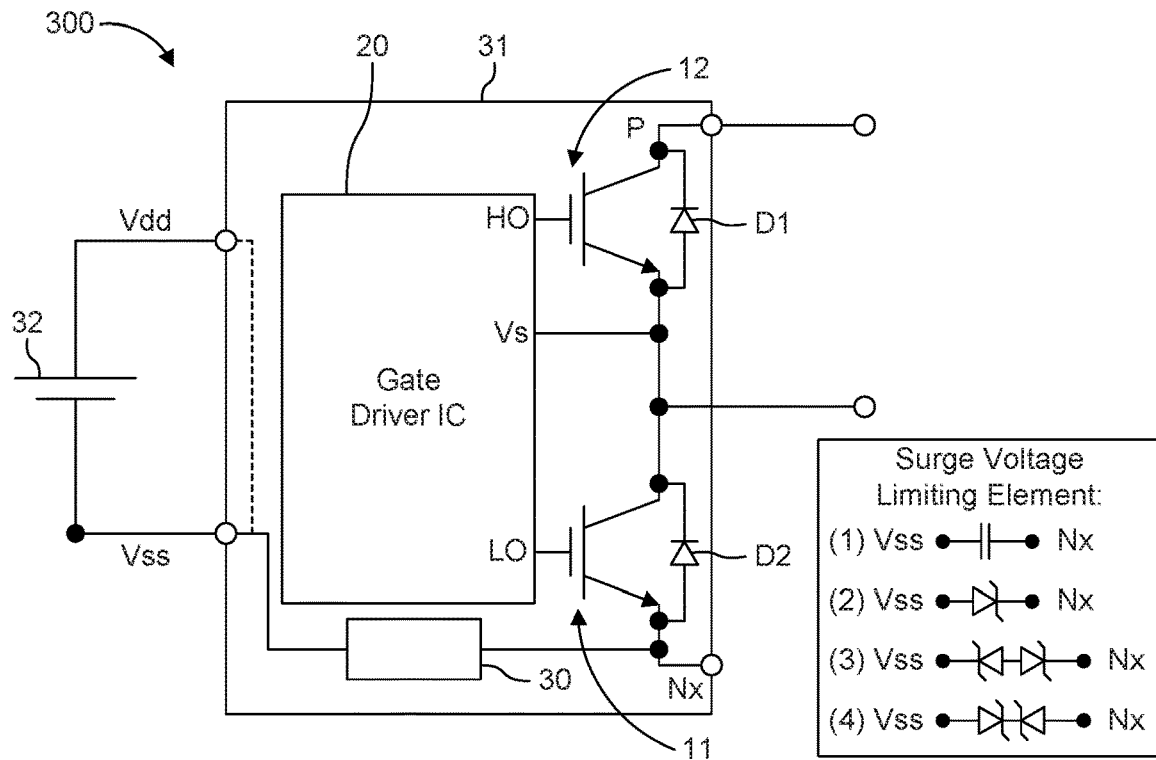
FIGS. 3A and 3B are schematic block diagrams of a power module according to one or more embodiments.
Figure 3B:
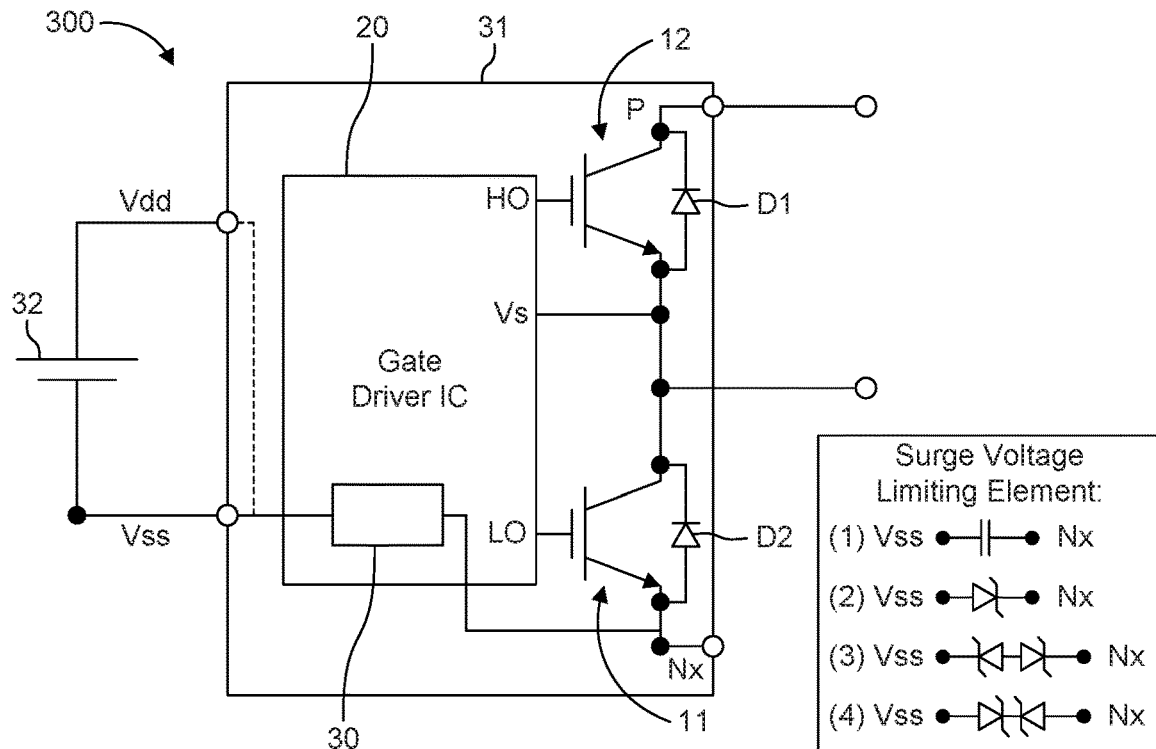
Figure 3C:
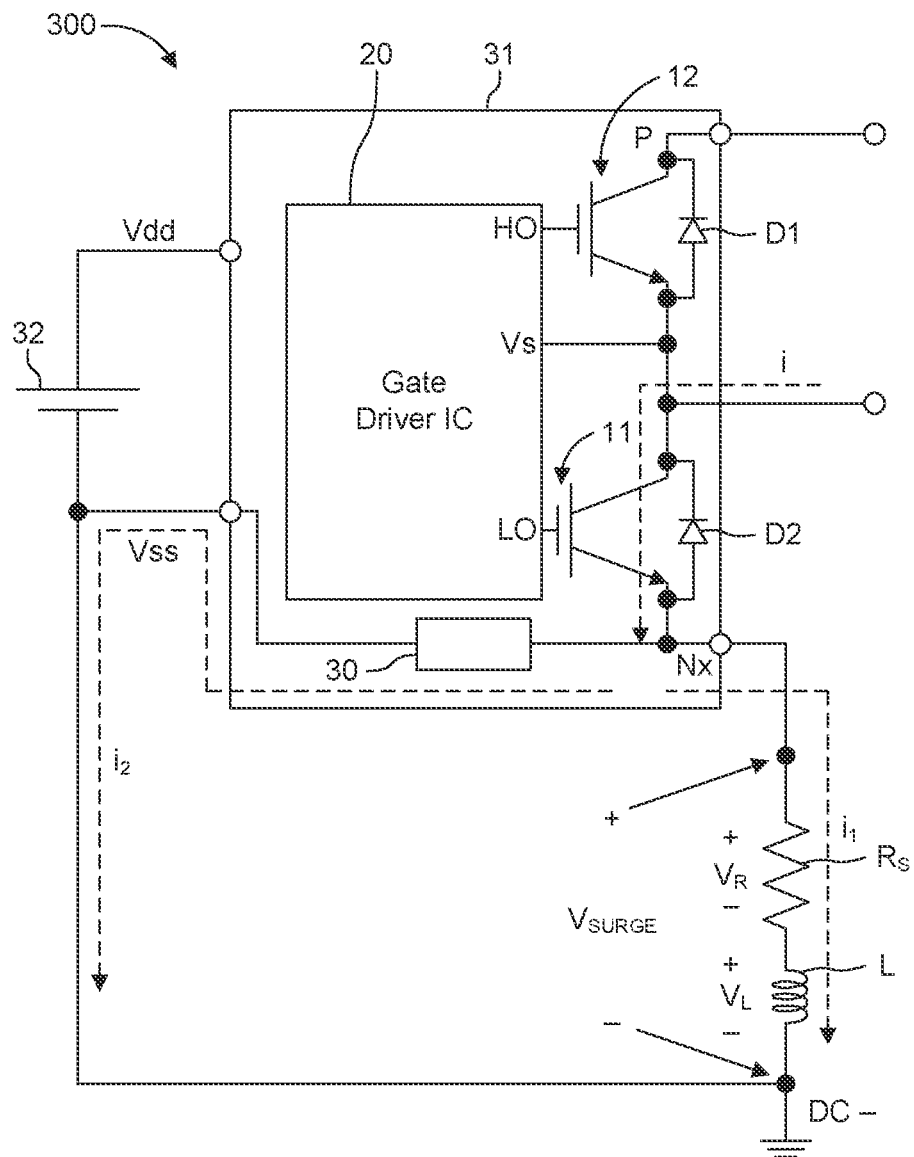
FIG. 3C is a schematic block diagram of the power module shown in FIG. 3A with additional external circuitry according to one or more embodiments.

FIGS. 3A and 3B are schematic block diagrams of a power module 300 according to one or more embodiments. The power module 300 in FIGS. 3A-3C is a simplified block diagram which has only one inverter leg. However, multiple legs can be embodied in one package. The power module 300 is similar to the power module 200 shown in FIG. 2 with the exception that power module 300 includes a surge voltage limiting element 30 integrated within a module package 31 of the power module 300.

As will be described herein, the surge voltage limiting element 30 may be integrated at the package level of the power module 300, but outside of the gate driver IC itself, as shown in FIG. 3A. Thus, in FIG. 3A, the surge voltage limiting element 30 is provided inside the package 31 but not on the gate driver IC 20. Alternatively, the surge voltage limiting element 30 may be implemented at the silicon level of the gate driver IC (i.e., integrated in the gate driver IC 20 monolithically), as shown in FIG. 3B. Thus, in FIG. 3B, the surge voltage limiting element 30 is placed inside the gate driver IC 20 with connections between the Nx and the Vss pins made monolithically. Thus, even if the voltage limiting element is located inside the driver IC, the two terminals of the voltage limiting element are connected between the Nx and Vss (or Vdd) terminals by wire bonding. The Nx pin is connected to the low side IGBT's emitter and the Vss pin is connected to Vss of the driver IC.

The surge voltage limiting element 30 is coupled between the emitter (or source) terminal of the low-side power transistor 11 and a low-side voltage pin of the power module, where the low-side voltage pin is a pin of a leadframe of the power module 300 and is configured to be coupled to a low-side voltage source 32. Thus, the low-side voltage pin of the power module is coupled to an outside connection, the outside connection being a power source that is external to the power module.

The emitter (or source) terminal of the low-side power transistor 11 is coupled to pin Nx of the power module 300. The Nx pin of the power module is a pin of a leadframe of the power module 300 and is coupled to an outside connection, the outside connection being external to the power module and being coupled to a negative power supply rail of the system, directly or through current sensing element. Thus, the surge voltage limiting element 30 is coupled between a low-side voltage pin and pin Nx of the leadframe of the power module.

The P pin of the power module is a pin of a leadframe of the power module 300 and is coupled to an outside connection, the outside connection being a positive bus input voltage, such as the positive power supply rail DC+. In particular, the P pin is the name for the module pin that is connected to the collector of high side power transistor inside the power module.

In the example illustrated in FIG. 3A, the low-side voltage pin is a Vss pin coupled to voltage Vss (i.e., the low-side ground voltage, also referred to as the low-side control negative supply).

In the alternative, the low-side voltage pin is a Vdd pin coupled to voltage Vdd (i.e., the low-side and logic fixed supply voltage; also referred to as the low-side control positive supply). This alternative connection is represented by a dashed line coupled to Vdd. Thus, the surge voltage limiting element 30 is placed inside the package 31 where it is coupled to the emitter (or source) terminal of the low-side power transistor 11 and to either Vss or Vdd.

The surge voltage limiting element 30 may be any component capable of limiting a surge voltage, and may be a capacitor or a clamp diode (e.g., a diode clamping circuit), for example. The key provided with FIGS. 3A and 3B show four example derivatives for the surge voltage limiting element 30, including: (1) a capacitor, (2) a Zener diode, (3) two Zener diodes coupled in series, back-to-back (i.e., with their anodes coupled together), and (4) two Zener diodes coupled in series, facing each other (i.e., with their cathodes coupled together). One or more Zener diodes can also be replaced with a Transient Voltage Suppressor (TVS) in these embodiments.

In addition, the surge voltage limiting element 30 may include any combination of two or more derivatives (1)-(4) coupled in parallel between pins Vss and Nx. For example, the surge voltage limiting element 30 may include two capacitors (i.e., derivatives (1) and (1)) coupled together in parallel between pins Vss and Nx. In another example, the surge voltage limiting element 30 may include a capacitor and a Zener diode (i.e., derivatives (1) and (2)) coupled together in parallel between pins Vss and Nx. In another example, the surge voltage limiting element 30 may include derivative (1) and derivative (3) coupled together in parallel between pins Vss and Nx. In another example, the surge voltage limiting element 30 may include derivative (1) and derivative (4) coupled together in parallel between pins Vss and Nx. Other series or parallel combination variants are also available.

In the case that the low-side power transistor 11 is turned on, current flows from the motor, through the low-side power transistor 11, and out of the pin Nx. Without the surge voltage limiting element 30, all the current that flows through the low-side power transistor 11 exits the power module 300 via pin Nx. Without being regulated, this exiting current i may cause a surge voltage that is induced by a stray inductance of the printed circuit board (PCB) pattern and a shunt resistor. This induced surge voltage can damage the power module 300 due to an electrical overstress failure. However, by integrating the surge voltage limiting element 30 in parallel to this exiting current i, part of the exiting current is diverted, being routed through the surge voltage limiting element 30 instead of entirely out of the pin Nx and through the stray inductance of the PCB. Thus, the surge voltage is reduced as a result of reducing the current exiting from pin Nx.

FIG. 3C is a schematic block diagram of the power module 300 of FIG. 3A with additional circuitry coupled to DC−, the negative DC link supply, according to one or more embodiments. In particular, a shunt resistor Rs is provided between output pin Nx and DC− in order to provide a current path for the load current. Thus, when the low-side power transistor 11 is on, the load current flows from the load (e.g., the motor), through the low-side power transistor 11, and through the shunt resistor Rs to the negative power supply rail. A stray inductance L is also shown in the external current path and represents the stray inductance of the PCB (not illustrated) to which the power module 300 and other external circuitry is placed.

Two parallel current branches, i1 and i2, are also depicted. Output current it is a portion of the load current that flows through the low-side power transistor 11, exits pin Nx of the power module 300, and flows to the negative DC link, DC− (i.e., ground). In this example, the collector/drain of the low-side power transistor 11 may be referred to as a first load path terminal of the transistor and the emitter/source of the low-side power transistor 11 may be referred to as a second load path terminal of the transistor. Thus, the load current flows through the transistor 11 from the first load path terminal to the second load path terminal when the transistor is turned ON. Thus, the second load path terminal, coupled to pin Nx, outputs the load current received from the motor, for example, when the low-side switch is turned ON and the high-side switch is turned OFF.

Current i2 is a portion of the load current that flows through the low-side power transistor 11, flows through the surge voltage limiting element 30, exits the power module 300 at a second pin of the power module 300, and flows to the negative DC link, DC− (i.e., ground). The second pin is the Vss pin or the Vdd of the power module 300.

A surge voltage $V_{SURGE}$ may be induced by current i1, where the surge voltage $V_{SURGE}$ is the sum of $V_R$ and $V_L$. However, by including the surge voltage limiting element 30 inside the package 31, some of the current that flows through the low-side power transistor 11 is routed through the surge voltage limiting element 30 as current i2, effectively reducing current i1 (i.e., current i1 is reduced by current i2). With current i1 being reduced, the surge voltage $V_{SURGE}$ induced by current i1 is also reduced. Thus, the likelihood of failure of the power module 300 can be reduced or prevented altogether. The above surge inducing mechanism is an example. When the low side switch is turned off, when the high side switch is turned off or when the high side switch is turned on, a similar phenomenon can happen, even the polarities of the current and induced voltage can be different. The surge can be applied between Nx and Vss. Any kind of surge voltage can also be protected by surge voltage limit element 30.

Equations (1)-(4) demonstrate the reduction of the surge voltage $V_{SURGE}$ based on the integration of the surge voltage limiting element 30 inside the package 31.

$$V_{SURGE} = V_R + V_L \quad \text{eq. (1)}$$

$$V_{SURGE} = R \times i_1 + L \times \frac{di_1}{dt} \quad \text{eq. (2)}$$

$$V_{SURGE} = R \times (i - i_2) + L \times \frac{d(i - i_2)}{dt} \quad \text{eq. (3)}$$

$$V_{SURGE} = \left(R \times i + L \times \frac{di}{dt}\right) - \left(R \times i_2 + L \times \frac{di_2}{dt}\right) \quad \text{eq. (4)}$$

Figure 4A:
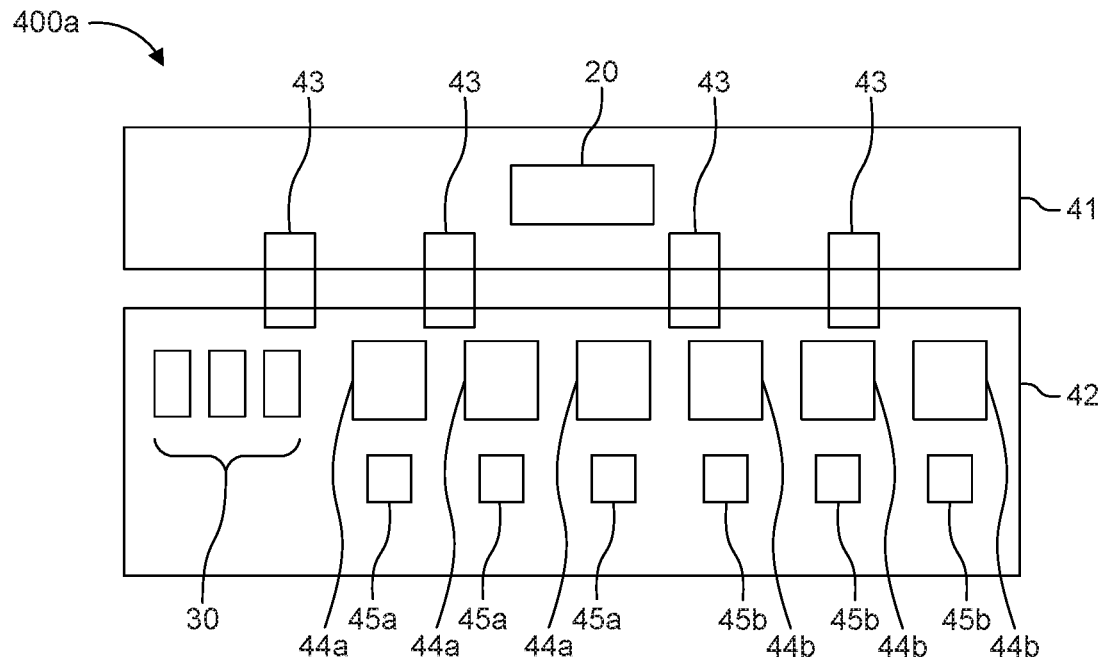
FIGS. 4A-4C are top-views of schematic block diagrams of power modules according to one or more embodiments.
Figure 4B:
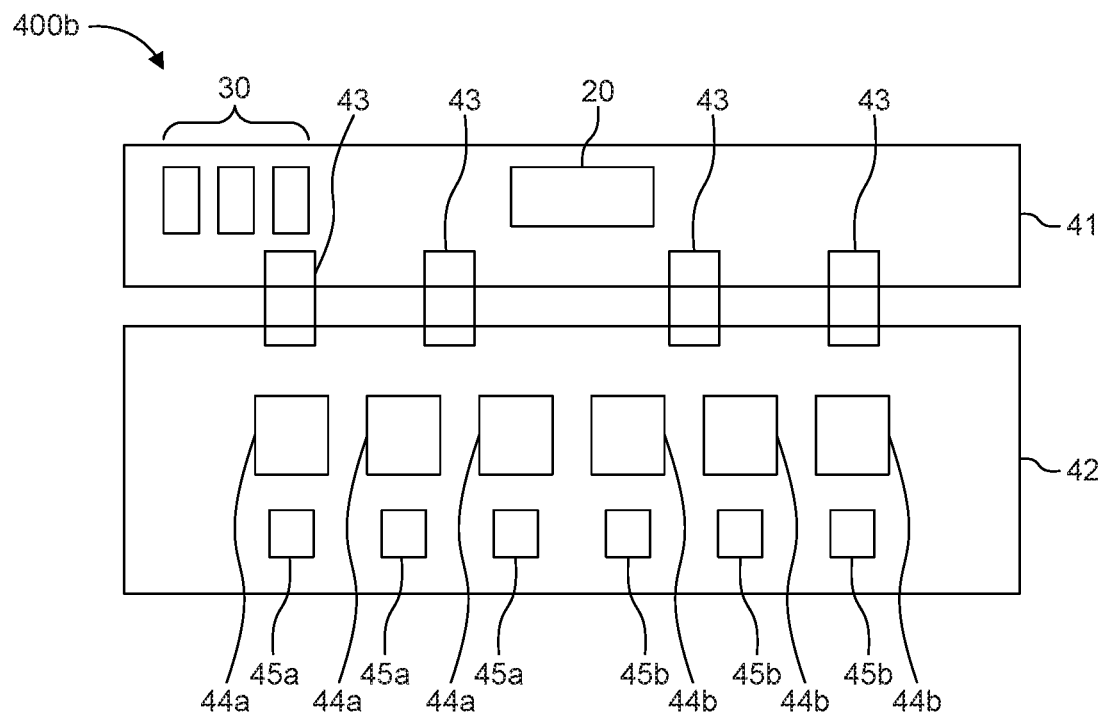
Figure 4C:
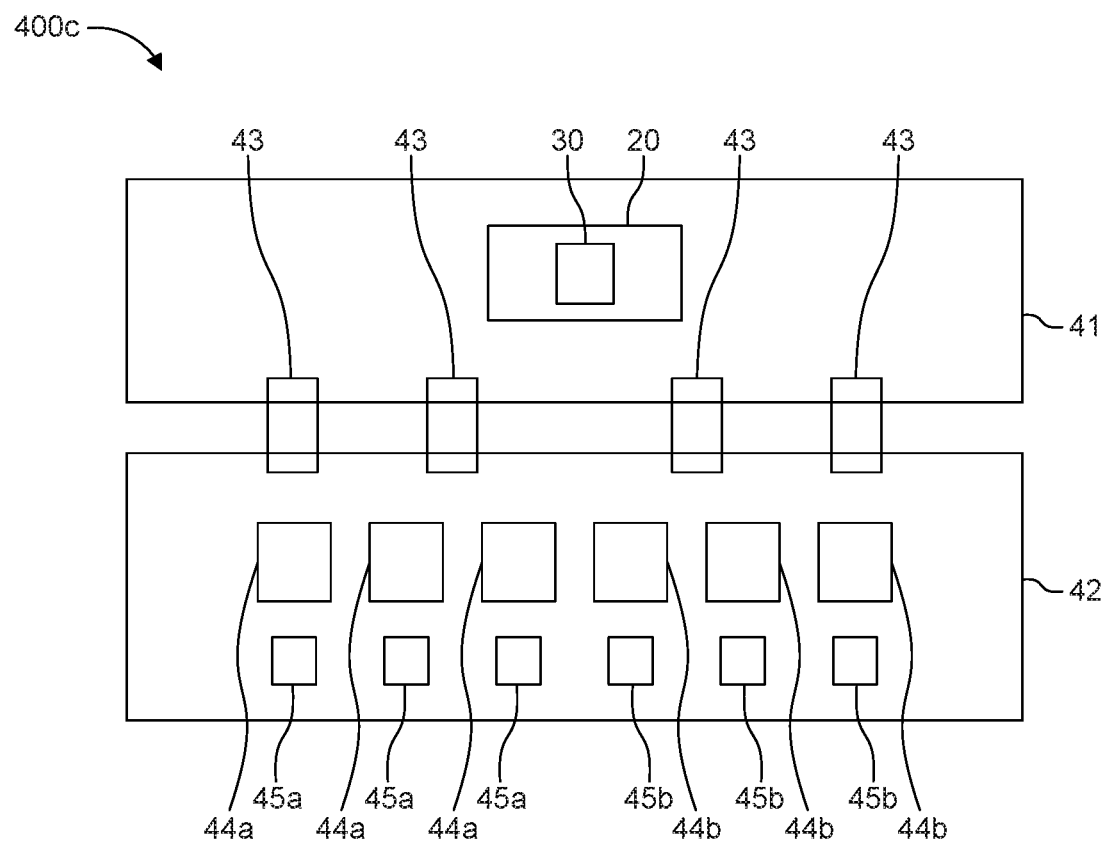

FIGS. 4A-4C are top-views of schematic block diagrams of power modules 400a, 400b, and 400c according to one or more embodiments. FIGS. 4A to 4C are examples of module which have three phase in one module package. Multiple packages are also available. In particular, FIGS. 4A-4C illustrate different locations within the power module (i.e., within the module package) at which the surge voltage limiting element 30 can be integrated. While not shown in this example, it is assumed that the power module 400 is incorporated into a single module package (e.g., module package 31 shown in FIGS. 3A-3C).

Turning to FIG. 4A, a power module 400a includes gate driver IC 20 arranged on and electrically coupled to a circuit substrate 41 (e.g., a printed circuit board (PCB)). The power module 400a further includes a leadframe 42 that is electrically coupled to the circuit substrate 41 by, for example, bondwires. The circuit substrate 41 is mechanically coupled to a leadframe 42 by at least one coupling structure 43. Some coupling structures 43 may provide an electrical connection.

In addition, multiple power transistor chips 44 and diode chips 45 are integrated on the leadframe 42. The power transistor chips 44 may include two groups 44a and 44b, where power transistor chips 44a include low-side power transistors and power transistor chips 44b include high-side power transistors. Thus, each power transistor chip 44 may include a low-side power transistor 11 or a high-side power transistor 12, where multiple transistors 11 and multiple transistors 12 are provided for a multi-phase system. In this example, three complementary pairs of power transistors for a three-phase system are provided.

Additionally, each diode chip 45 may include a freewheeling diode coupled to one of the power transistors. The diode chip 44 may include two groups 45a and 45b, where diode chips 45a are coupled to a corresponding low-side power transistor and diode chips 45b are coupled to a corresponding high-side power transistor.

Surge voltage limiting elements 30 are also integrated on the leadframe 42 in a region (e.g., a low-side region) of the leadframe next to the low-side power transistor chips 44a. That is, the low-side power transistor chips 44a are interposed between the surge voltage limiting elements 30 and the high-side power transistor chips 44b. Thus, the surge voltage limiting elements 30 may be provided between the low-side power transistor chips 44a and a periphery (i.e., an edge) of the leadframe 42.

A surge voltage limiting element 30 is provided for each low-side power transistor chip (i.e., for each inverter leg), and coupled to the emitter (or source) of the corresponding low-side power transistor. Thus, since a three-phase system is shown, three surge voltage limiting elements 30 are provided.

Turning to FIG. 4B, FIG. 4B illustrates a power module 400b that is similar to power module 400a, with the exception that the surge voltage limiting elements 30 are integrated on the circuit substrate 41 near or next to the gate driver IC 20.

Turning to FIG. 4C, FIG. 4C illustrates a power module 400c that is similar to power modules 400a and 400b, with the exception that the surge voltage limiting elements 30 are integrated on gate driver IC 20. In other words, the surge voltage limiting elements 30 are added monolithically in the gate driver IC 20.

In view of the above, embodiments provide one or more voltage limiting elements inside a module package or monolithically inside the gate driver IC, for example, silicon capacitors or trench capacitors. The fewer number of voltage limiting element than the number of leg can be integrated in one package. The voltage limiting elements are not limited to capacitors but can be clamp diodes either physically embedded in the module or monolithically embedded in the gate driver IC. Accordingly, an EOS robust device may be provided that provides higher quality power modules and reduces the engineering cost associated with failure analysis and root cause determination.

It will be appreciated that the gate driver IC 20 of the power module may be configured drive a low-side power transistor, both a high-side power transistor and a low-side power transistor, or multiple low-side power transistors, or any combination of driving one or more low-side power transistors with or without driving a high-side power transistor. In the case that the gate driver IC 20 does not drive one or more high-side power transistors, a separate gate driver IC may be integrated in the power module and used to drive the high-side power transistor(s). Regardless of configuration, a gate driver IC is used in combination with one or more surge voltage limiting elements 30 to reduce the current exiting from pin Nx of the power module.

When considering the embodiment in which the surge voltage limiting element 30 is integrated into a gate driver IC, and when further considering using separate voltage domains (e.g., LV and HV domains) in the power module, the surge voltage limiting element 30 may be integrated into the gate driver IC that drives the low-side power transistor(s) (i.e., the gate driver IC that is located in the lower voltage domain).

While various embodiments have been described, it will be apparent to those of ordinary skill in the art that many more embodiments and implementations are possible within the scope of the disclosure. Accordingly, the invention is not to be restricted except in light of the attached claims and their equivalents. With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein refers to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements.

Thus, the techniques described in this disclosure may be implemented, at least in part, in hardware, software, firmware, or any combination thereof. For example, various aspects of the described techniques may be implemented within one or more processors, including one or more microprocessors, DSPs, ASICs, or any other equivalent integrated or discrete logic circuitry, as well as any combinations of such components.

A control unit including hardware may also perform one or more of the techniques described in this disclosure. Such hardware, software, and firmware may be implemented within the same device or within separate devices to support the various techniques described in this disclosure. Software may be stored on a non-transitory computer-readable medium such that the non-transitory computer readable medium includes a program code or a program algorithm stored thereon which, when executed, causes a computer program to perform the steps of a method.

Although various exemplary embodiments have been disclosed, it will be apparent to those skilled in the art that various changes and modifications can be made which will achieve some of the advantages of the concepts disclosed herein without departing from the spirit and scope of the invention. It will be obvious to those reasonably skilled in the art that other components performing the same functions may be suitably substituted. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

What is claimed is:

1. A power module, comprising:
a high-side power transistor;
a low-side power transistor coupled to the high-side power transistor, the low-side power transistor comprising a first load path terminal through which a load current enters the low-side power transistor and a second load path terminal through which the load current exits the low-side power transistor;
a gate driver integrated circuit (IC) configured to drive at least one of the high-side power transistor and the low-side power transistor;
a leadframe having a low-side voltage pin configured to be coupled to a low-side voltage source;
a surge voltage limiting element coupled between the second load path terminal of the low-side power transistor and the low-side voltage pin, wherein the surge voltage limiting element comprises a first terminal coupled to the second load path terminal and a second terminal coupled to the low-side voltage pin; and a module package, wherein the high-side power transistor, the low-side power transistor, the gate driver IC, the leadframe, and the surge voltage limiting element are encapsulated in the module package, wherein the first load path terminal is configured to receive the load current while the low-side power transistor is turned on, and wherein, while the low-side power transistor is turned on, the first terminal of the surge voltage limiting element is configured to receive a first portion of the load current from the second load path terminal and the second terminal of the surge voltage limiting element is configured to output the first portion of the load current to the low-side voltage pin, wherein the first portion of the load current is configured to flow from the second terminal of the surge voltage limiting element to the low-side voltage pin and exit the module package from the low-side voltage pin.

2. The power module of claim 1, wherein the low-side voltage pin is a Vss pin or a Vee pin.

3. The power module of claim 1, wherein the low-side voltage pin is a Vdd pin or a Vcc pin.

4. The power module of claim 1, wherein the second load path terminal is an emitter terminal or a source terminal.

5. The power module of claim 1, wherein the leadframe includes a further pin configured to be coupled to a negative power supply rail, wherein a second portion of the load current is configured to exit the module package from the further pin.

6. The power module of claim 5, wherein the second load path terminal and the first terminal of the surge voltage limiting element are coupled to the further pin.

7. The power module of claim 5, wherein the first portion of the load current is configured to exit the module package from the low-side voltage pin while the second portion of the load current exits the module package from the further pin such that the first and the second portions of the load current concurrently exit the module package via two separate, parallel current paths.

8. The power module of claim 1, wherein the first portion and a second portion of the load current are configured to flow towards the negative power supply rail in parallel current paths.

9. The power module of claim 1, wherein the first terminal of the surge voltage limiting element is coupled directly to the second load path terminal of the low-side power transistor and the second terminal of the surge voltage limiting element is coupled directly to the low-side voltage pin.

10. The power module of claim 1, wherein the surge voltage limiting element includes a capacitor, a Zener diode, or a combination thereof.

11. The power module of claim 1, further comprising:
a high-side region that operates in a first voltage domain; and
a low-side region that operates in a second voltage domain lower than the first voltage domain, wherein the low-side voltage source supplies power to the low-side region.

12. The power module of claim 1, wherein the surge voltage limiting element, the high-side power transistor, and the low-side power transistor are integrated on the leadframe.

13. The power module of claim 12, wherein the low-side power transistor is interposed between the surge voltage limiting element and the high-side power transistor.

14. The power module of claim 1, further comprising:
a printed circuit board (PCB) on which the gate driver IC is arranged and electrically coupled thereto,
wherein the surge voltage limiting element is integrated on the PCB.

15. The power module of claim 1, further comprising:
a printed circuit board (PCB) on which the gate driver IC is arranged and electrically coupled thereto,
wherein the surge voltage limiting element is integrated on the gate driver IC.

16. The power module of claim 15, wherein the gate driver IC is configured to drive the low-side power transistor.

17. A power circuit, comprising:
a power module, comprising:
a high-side power transistor;
a low-side power transistor coupled to the high-side power transistor, the low-side power transistor comprising a first load path terminal through which a load current enters the low-side power transistor and a second load path terminal through which the load current exits the low-side power transistor;
a gate driver integrated circuit (IC) configured to drive at least one of the high-side power transistor and the low-side power transistor;
a leadframe having a low-side voltage pin coupled to a low-side voltage source, and a further pin coupled to the second load path terminal of the low-side power transistor and to a negative power supply rail;
a surge voltage limiting element coupled between the low-side voltage pin and the further pin, wherein the surge voltage limiting element provides a first current path for a first portion of the load current that flows through the low-side power transistor, wherein the surge voltage limiting element comprises a first terminal coupled to the second load path terminal and a second terminal coupled to the low-side voltage pin; and
a module package, wherein the high-side power transistor, the low-side power transistor, the gate driver IC, the leadframe, and the surge voltage limiting element are encapsulated in the module package,
wherein the first load path terminal is configured to receive the load current while the low-side power transistor is turned on, and
wherein, while the low-side power transistor is turned on, the first terminal of the surge voltage limiting element is configured to receive the first portion of the load current from the second load path terminal and the second terminal of the surge voltage limiting element is configured to output the first portion of the load current to the low-side voltage pin; and
an external circuit that is external to the power module and coupled to the further pin, wherein the external circuit provides a second current path for a second portion of the load current that flows through the low-side power transistor,
wherein the first portion of the current is configured to flow from the second terminal of the surge voltage limiting element to the low-side voltage pin and exit the module package from the low-side voltage pin.

18. The power circuit of claim 17, wherein the first current path and the second current path are parallel current paths interposed between the second load path terminal of the low-side power transistor and the negative power supply rail.

19. The power circuit of claim 17, wherein the surge voltage limiting element includes a capacitor, a Zener diode, or a combination thereof.

20. The power module of claim 17, wherein the first portion of the load current is configured to flow through the surge voltage limiting element while the low-side power transistor is turned on.

21. The power circuit of claim 17, wherein the first portion of the load current is configured to exit the module package from the low-side voltage pin while the second portion of the load current exits the module package from the further pin such that the first and the second portions of the load current concurrently exit the module package via two separate, parallel current paths.

22. The power circuit of claim 21, wherein the external circuit comprises a stray inductance and a current limiting element connected in series between the further pin and the negative power supply rail.

* * * * *